United States Patent
Li

(10) Patent No.: US 7,564,440 B2
(45) Date of Patent: Jul. 21, 2009

(54) SHIFT REGISTER UNIT

(75) Inventor: Yan-Liang Li, Fongshan (TW)

(73) Assignee: TPO Displays Corp., Miao-Li County (TW)

(*) Notice: Subject to any disclaimer, the term of this patent is extended or adjusted under 35 U.S.C. 154(b) by 801 days.

(21) Appl. No.: 11/035,893

(22) Filed: Jan. 18, 2005

(65) Prior Publication Data
US 2006/0158419 A1    Jul. 20, 2006

(51) Int. Cl.
*G09G 3/36* (2006.01)
(52) U.S. Cl. .............................. 345/100; 345/98; 377/64
(58) Field of Classification Search ................. 345/100, 345/197, 64–81, 559
See application file for complete search history.

(56) References Cited

U.S. PATENT DOCUMENTS 6,509,894 B1* 1/2003 Maekawa et al. ........... 345/211
6,879,313 B1* 4/2005 Kubota et al. ............... 345/100
2004/0028172 A1* 2/2004 Yu .............................. 377/64

FOREIGN PATENT DOCUMENTS

CN    1369871    9/2002
JP    08-212794    8/1996

* cited by examiner

*Primary Examiner*—Amr Awad
*Assistant Examiner*—Jeff Pelligrino
(74) *Attorney, Agent, or Firm*—MH2 Technology Law Group LLP

(57) ABSTRACT

A shift register unit capable of generating two output pulses in turn. In the shift register unit, a first unit receives a start pulse and a clock signal to output a first output pulse during a first period. A second unit receives the first output pulse and an inverse signal of the clock signal to output a second output pulse during a second period.

14 Claims, 8 Drawing Sheets

SHIFT REGISTER UNIT

BACKGROUND OF THE INVENTION

1. Field of the Invention

The present invention relates to a shift register unit and, more particularly, to a shift register unit capable of generating two output pulses in turn.

2. Description of the Related Art

FIG. 1 shows a conventional shift register unit 10. A conventional signal driving circuit (not shown) includes a plurality of shift register units 10 generating pulses in turn for driving an LCD panel. FIG. 2 is a timing chart of the input pulse STB, CLK and $\overline{CLK}$ according to the conventional shift register unit 10 shown in FIG. 1. In the conventional shift register unit 10, however, the duty cycle TC of the clock pulses CLK and $\overline{CLK}$ must be completed within the duty cycle TS of the input pulse STB. Further, due to control of the clock pulses CLK and $\overline{CLK}$, the clock inverters CINV4 and CINV5 switch repeatedly, and thus, consume excessive power. Furthermore, the conventional shift register unit requires greater chip area due to the number of the elements required therein.

Thus, there is a need to overcome these and other problems of the prior art and to provide a shift register unit with reduced power consumption and a shift register unit with a reduced number of elements to reduce the required chip area. Further, there is a need to provide a shift register unit capable of generating two output pulses in turn.

SUMMARY OF THE INVENTION

According to various embodiments, there is provided a shift register unit, wherein a first unit receives a start pulse and a clock signal to output a first output pulse during a first period. A second unit receives the first output pulse and an inverse signal of the clock signal to output a second output pulse during a second period.

According to various other embodiments, there is provided a shift register unit, wherein a first clock inverter outputs a first output pulse through a first inverter according to a start pulse and a clock signal during a first period, and a second clock outputs a second output pulse through a second inverter according to the first output pulse and an inverse signal of the clock signal during a second period.

DETAILED DESCRIPTION OF THE INVENTION

Figure 3:
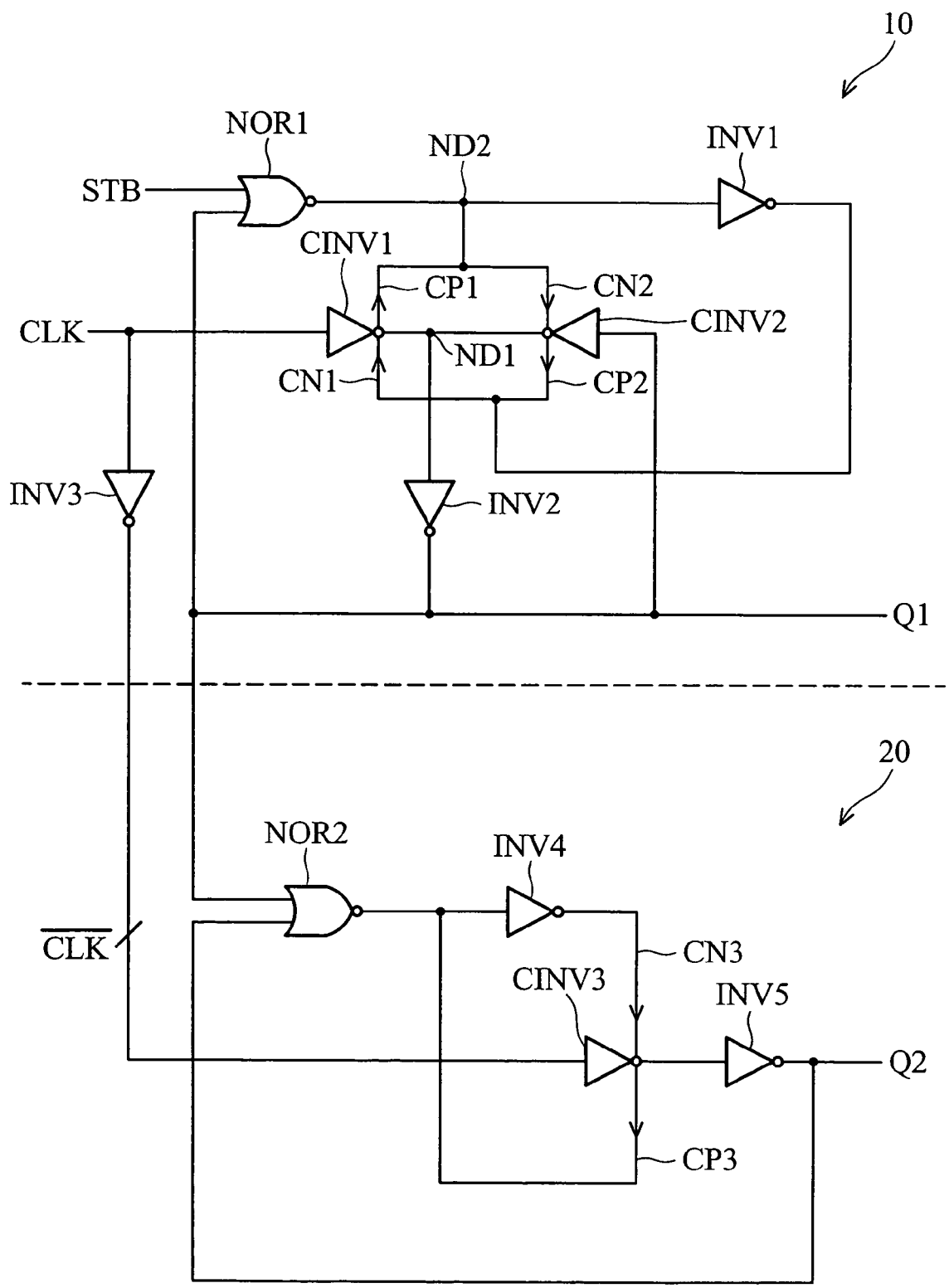
FIG. 3 is a schematic diagram of a shift register unit according to various embodiments of the present teachings.

FIG. 3 is a schematic diagram of a shift register unit according to various embodiments of the present teachings. In FIG. 3, the shift register unit 200 can include a first unit 10 and a second unit 20. The first unit 10 receives a start pulse STB and a clock signal CLK to output a first output pulse Q1 during a first period, and the second unit 20 receives the first output pulse Q1 and an inverse signal $\overline{CLK}$ of the clock signal to output a second output pulse Q2 during a second period.

In various embodiments, the first unit 10 can comprise a NOR gate NOR1, two clock inverters CINV1 and CINV2, and three inverters INV1, INV2 and INV3.

The NOR gate NOR1 comprises a first input terminal coupled to the start pulse STB and a second input terminal coupled the output of the inverter INV2. The first clock inverter CINV1 comprising an input terminal coupled to the clock signal CLK, a first control terminal CP1 coupled the output terminal of the NOR gate NOR1, a second control terminal CN1 coupled output terminal of the inverter INV1, and an output terminal coupled to a node ND1. The inverter INV1 comprises an input terminal coupled to the output terminal of the NOR gate NOR1, the first control terminal CP1 of the clock inverter CINV1 and the second control terminal CN2 of the clock inverter CINV2, and an output terminal coupled to the second control terminal CN1 of the clock inverter CINV1 and the first control terminal CP2 of the clock inverter CINV2. The clock inverter CINV2 comprises an input terminal coupled to the output terminal of the inverter INV2, a first control terminal CP2 coupled to the output terminal of the inverter INV1, a second control terminal CN2 coupled to the output terminal of the NOR gate NOR1, and an output terminal coupled to the node ND1. The inverter INV2 comprises an input terminal coupled to the node ND1 and an output terminal coupled to the input terminal of the clock inverter CINV2 and the second input terminal of the NOR gate NOR1. The inverter INV3 comprising an input terminal receives the clock signal CLK and outputs an inverse signal $\overline{CLK}$ of the clock signal CLK.

The second unit 20 comprises a NOR gate NOR2, a clock inverter CINV3, and two inverters INV4 and INV5. The NOR gate NOR2 comprises a first input terminal coupled to the second input terminal of the NOR gate NOR1 and the output terminal of the inverter INV2, a second input terminal coupled to output terminal of the inverter INV5, and an output terminal coupled to input terminal of the inverter INV4 and a first control terminal CP3 of the clock inverter CINV3. The clock inverter CINV3 comprises an input terminal coupled to the inverse signal $\overline{CLK}$ of the clock signal CLK, a first control terminal coupled to the output terminal of the NOR gate NOR2 and the input terminal of the inverter INV4, a second control terminal coupled to the output terminal of the inverter INV4, and an output terminal coupled to the inverter INV5. The inverter INV5 comprises an input terminal coupled to the output terminal of the clock inverter CINV3 and an output terminal coupled to the second input terminal of the NOR gate NOR2.

Figure 4:
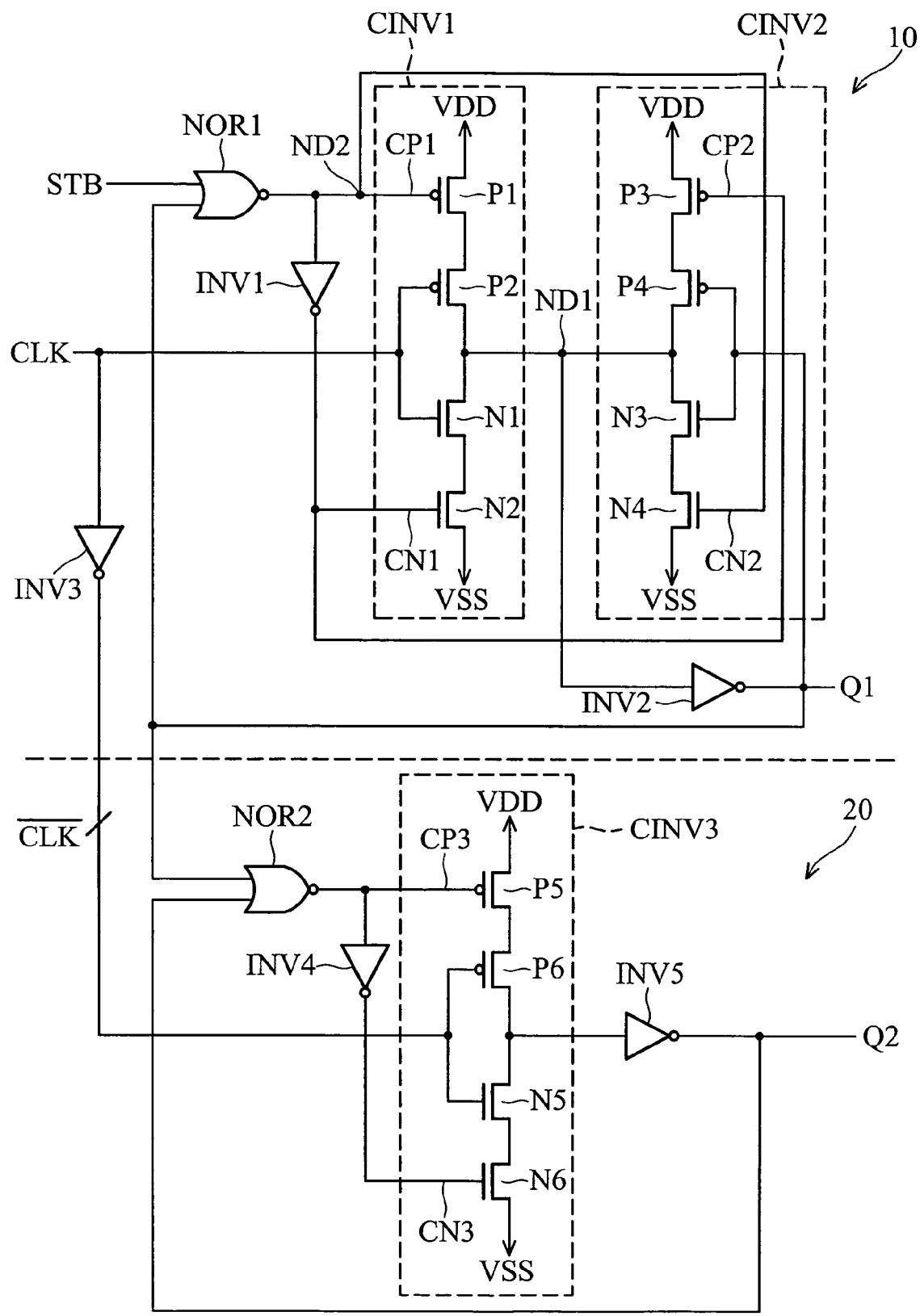
FIG. 4 is another schematic diagram of a shift register unit according to various embodiments of the present teachings.

FIG. 4 is another diagram of the shift register unit 200 according to various embodiments of the present teachings. As shown in FIG. 4, the clock inverter CINV1 comprises two PMOS transistors P1 and P2, and two NMOS transistors N1 and N2. The clock inverter CINV2 comprises two PMOS transistors P3 and P4, and two NMOS transistors N3 and N4, and the clock inverter CINV3 comprises two PMOS transistors P5 and P6, and two NMOS transistors N5 and N6. In clock inverter CINV1, the PMOS transistor P1 comprises a first terminal coupled to a first voltage VDD, a control terminal coupled to the output terminal of the NOR gate NOR1 and the input terminal of the inverter INV1, and a second terminal. The PMOS transistor P2 comprises a first terminal coupled to the second terminal of the PMOS transistor P1, a control terminal coupled to the clock signal CLK, and a second terminal coupled the node ND1. The NMOS transistor N1 comprises a first terminal coupled to the node ND1, and a control terminal coupled to the control terminal of the PMOS transistor P2, and a second terminal. The NMOS transistor N2 comprises a first terminal coupled to the second terminal of the NMOS transistor N1, a control terminal coupled to the output terminal of the inverter INV1, and a second terminal coupled to a second voltage VSS.

Further, in the clock inverter CINV2, the PMOS transistor P3 comprises a first terminal coupled to a first voltage VDD, a control terminal coupled to the output terminal of the inverter INV1, and a second terminal. The PMOS transistor P4 comprises a first terminal coupled to the second terminal of the PMOS transistor P3, a control terminal coupled to the output terminal of inverter INV2, and a second terminal coupled the node ND1. The NMOS transistor N3 comprises a first terminal coupled to the node ND1, a control terminal coupled to the control terminal of the PMOS transistor P4, and a second terminal. The NMOS transistor N4 comprises a first terminal coupled to the second terminal of the NMOS transistor N3, a control terminal coupled to the output terminal of the NOR gate NOR1, and a second terminal coupled to a second voltage VSS.

Furthermore, in the clock inverter CINV3, the PMOS transistor P5 comprises a first terminal coupled to a first voltage VDD, a control terminal coupled to the output terminal of the NOR gate NOR2, and a second terminal. The PMOS transistor P6 comprises a first terminal coupled to the second terminal of the PMOS transistor P5, a control terminal coupled to the inverse signal $\overline{CLK}$ of the clock signal CLK, and a second terminal coupled to the input terminal of the inverter INV5. The NMOS transistor N5 comprises a first terminal coupled to the input terminal of the inverter INV5, a control terminal coupled to the control terminal of the PMOS transistor P6, and a second terminal. The NMOS transistor N6 comprises a first terminal coupled to the second terminal of the NMOS transistor N5, a control terminal coupled to the output terminal of the inverter INV4, and a second terminal coupled to the second voltage VSS.

Figure 5:
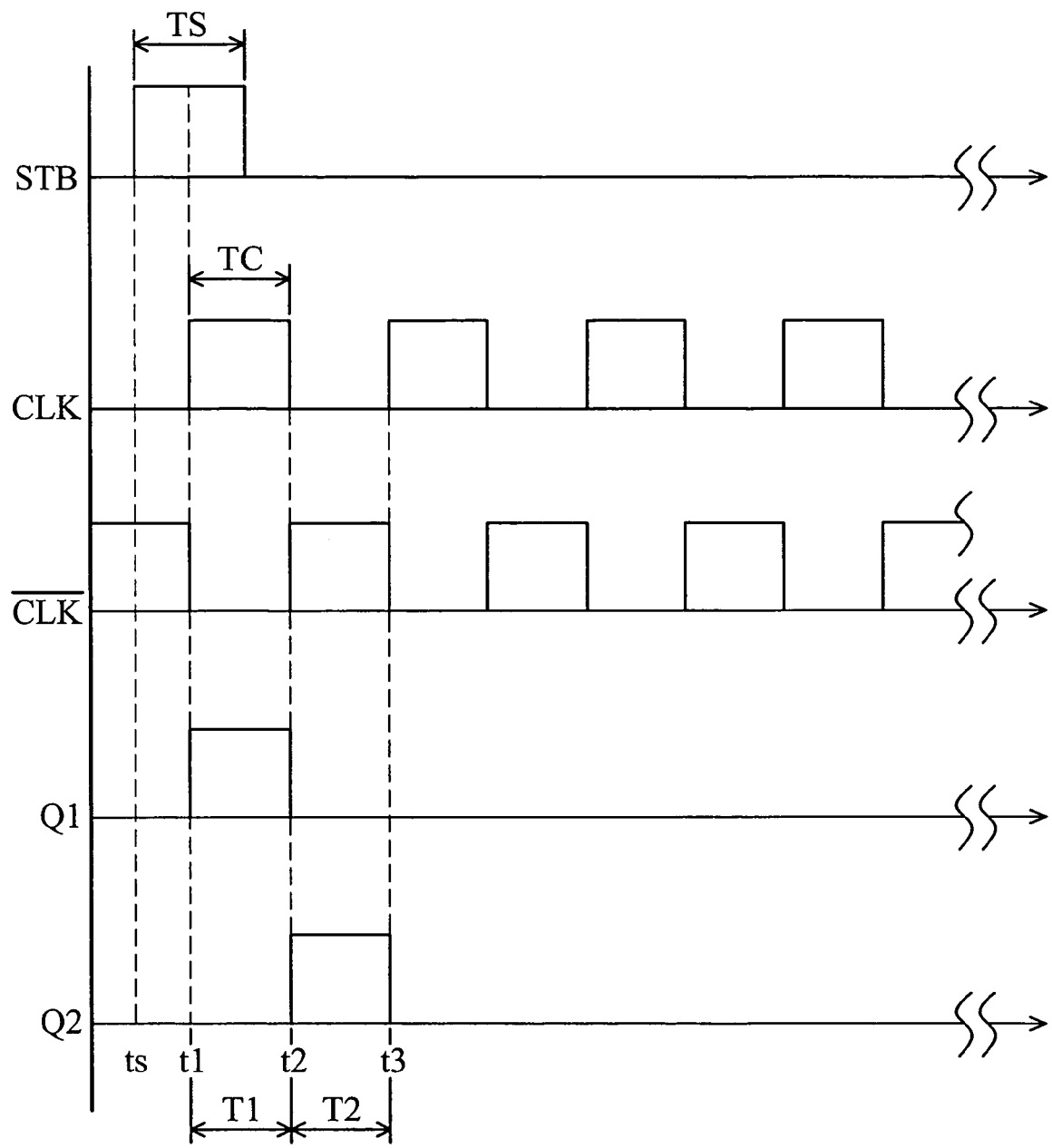
FIG. 5 is an operation signal diagram of the shift register units 200 and 200' according to various embodiments of the present teachings.

FIG. 5 is an operation signal diagram of the shift register unit 200 according to the above embodiment. Operation of the shift register unit 200' is described herein, with reference to FIGS. 4 and 5.

Initially, the MOS transistors P1, P5, N2 and N6 are turned off and the MOS transistors P3 and N4 are turned on because the output pulse Q1 of the first unit 10 and the start pulse STB are logic 0. Accordingly, the clock inverter CINV1 is turned off, the clock inverter CINV2 and the inverter INV2 latch the output pulse Q1 of logic 0, and the clock inverter CINV3 is turned off such that the output pulse Q2 is maintained at logic 0.

At time ts, the start pulse STB is output to the first input terminal of the NOR gate NOR1 such that the MOS transistors P1 and N2 are turned on and the MOS transistors P3 and N4 are turned off. Accordingly, the clock inverter CINV1 is turned on and the clock inverter CINV2 is turned off.

During a first period T1, the clock signal CLK of a first level, such as logic 1 is input to the clock inverter CINV1, and converted thereby into a first signal of logic 0 and output to the inverter INV2. The inverter INV2 then outputs a first output pulse Q1 of logic 1. At this time, the clock inverter CINV3 is turned on and the output terminal of the inverter INV5 is maintained at logic 0 due to the inverse signal $\overline{CLK}$ of the clock signal CLK.

During a second period T2, the clock signal CLK changes to logic 0 and the inverse signal $\overline{CLK}$ of the clock signal CLK changes to logic 1. At this time, the output terminal of the inverter INV2 changes to logic 0, the clock inverter CINV1 is turned off, and thus, the output pulse Q1 can be maintained at logic 0 until the next first period. Additionally, the inverse signal $\overline{CLK}$ of logic 1 is input to the clock inverter CINV3, and converted thereby into a second signal of logic 0 and outputs to the inverter INV5. The inverter INV5 then outputs a second output pulse Q2 of logic 1. Furthermore, the clock inverter CINV3 is turned off when the inverse signal $\overline{CLK}$ again changes to logic 0, and thus, the output pulse Q2 can be maintained at logic 0 until the next second period.

Figure 1:
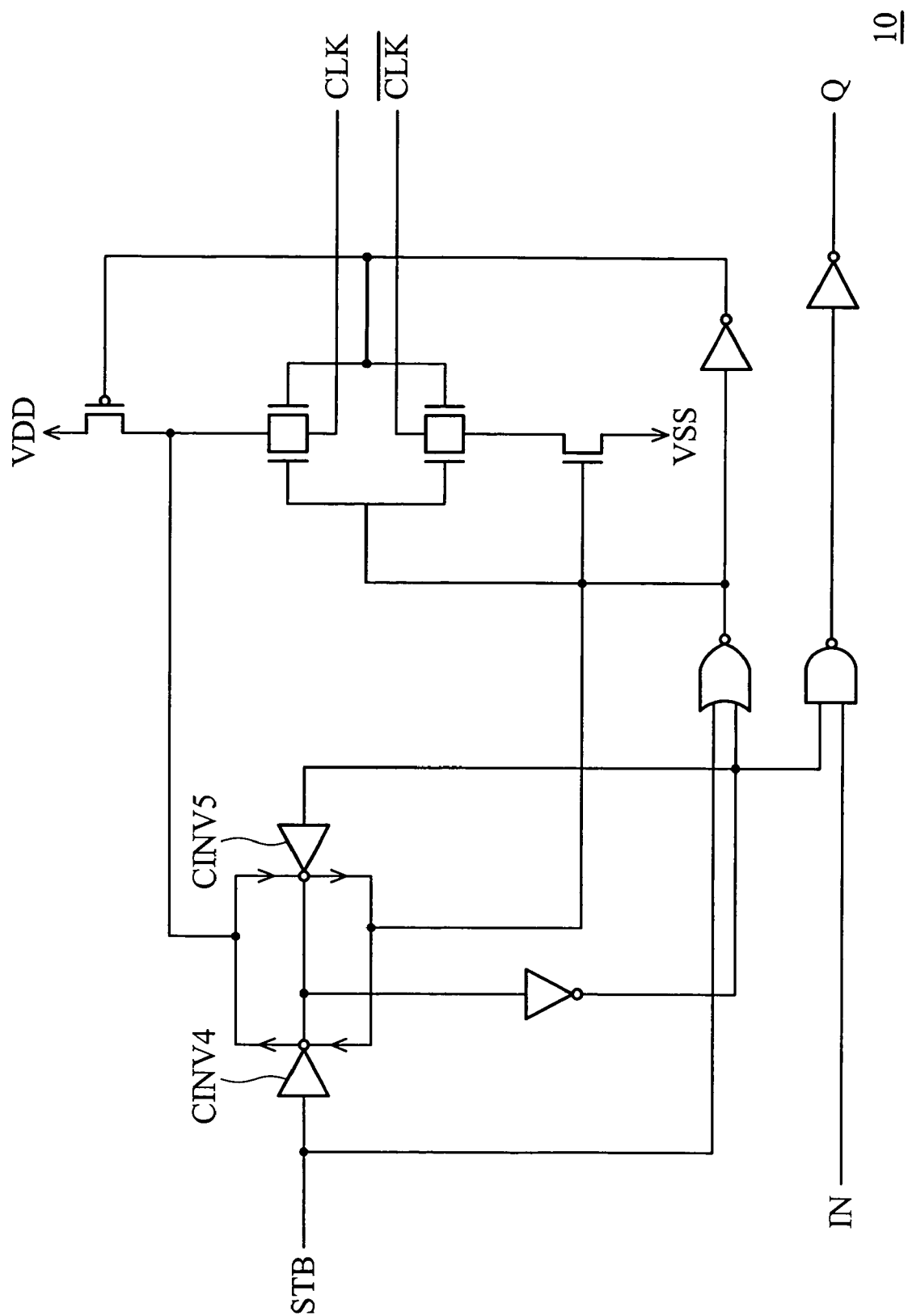
FIG. 1 shows a conventional shift register unit.
Figure 2:
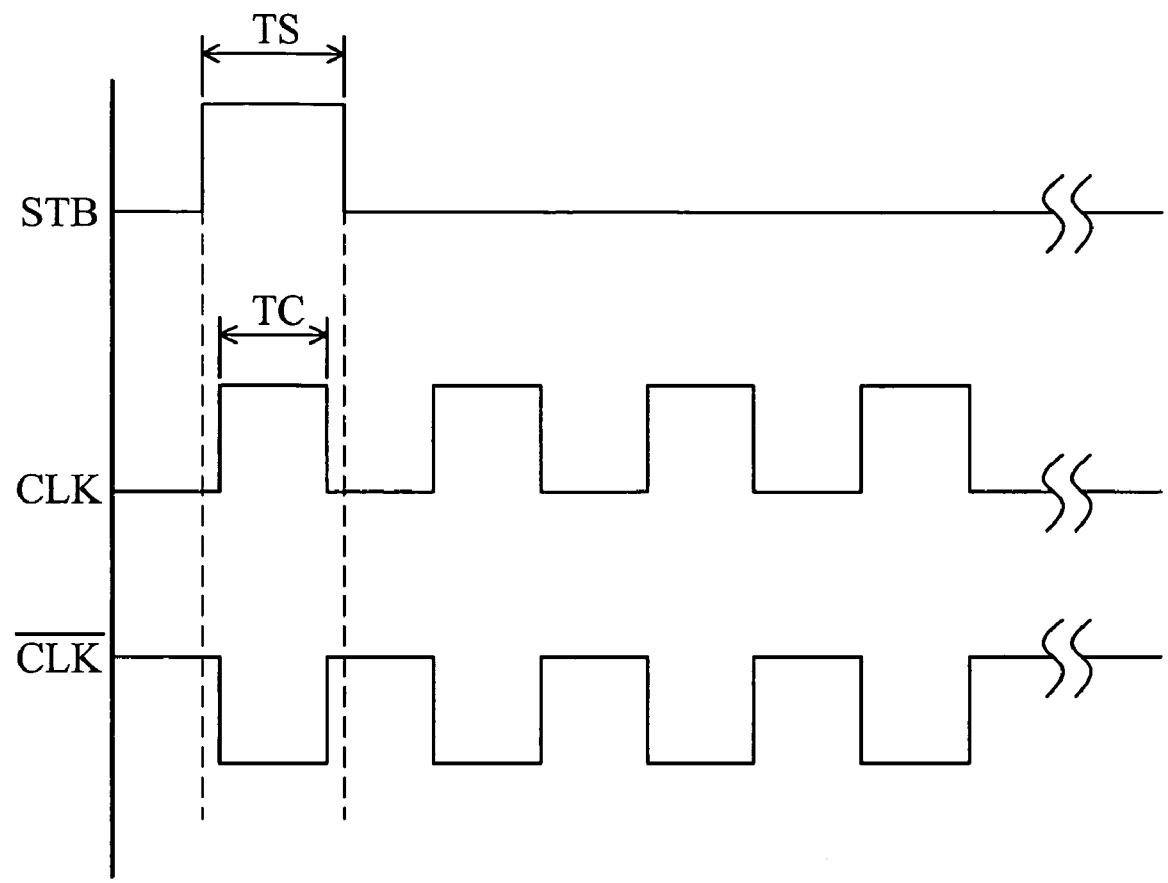
FIG. 2 is an operation signal diagram of the conventional shift register unit shown in FIG. 1.

As shown in FIG. 5, the duty cycle TC of the clock signal CLK is not required to be completed within the duty cycle TS of the start pulse STB. Thus, the operation of the shift register unit according to various embodiments of the present teachings has better tolerance. Additionally, the conventional shift register shown in FIG. 1 needs two clock inverters, three inverters, two transmission gates, two MOS transistors, a NOR gate and a NAND gate to generate one output pulse for driving a display element. In contrast, shift register unit 200 only requires three clock inverters, five inverters and two NOR gates to generate two output pulses in turn. Shift register units in accordance with present teachings, such as, shift register 200, require fewer transistors and less chip area.

Figure 6:
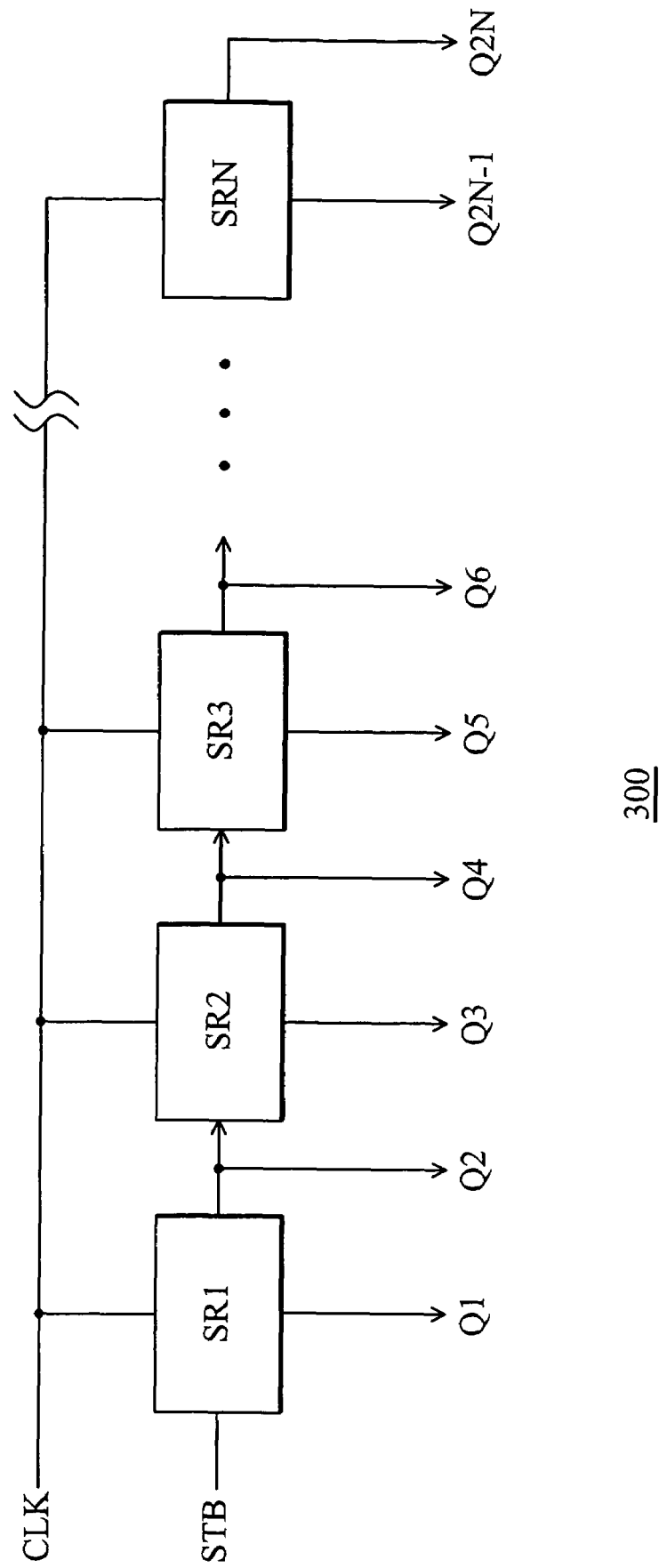
FIG. 6 is a schematic diagram of the signal driving circuit according to various embodiments of the present teachings.
Figure 7:
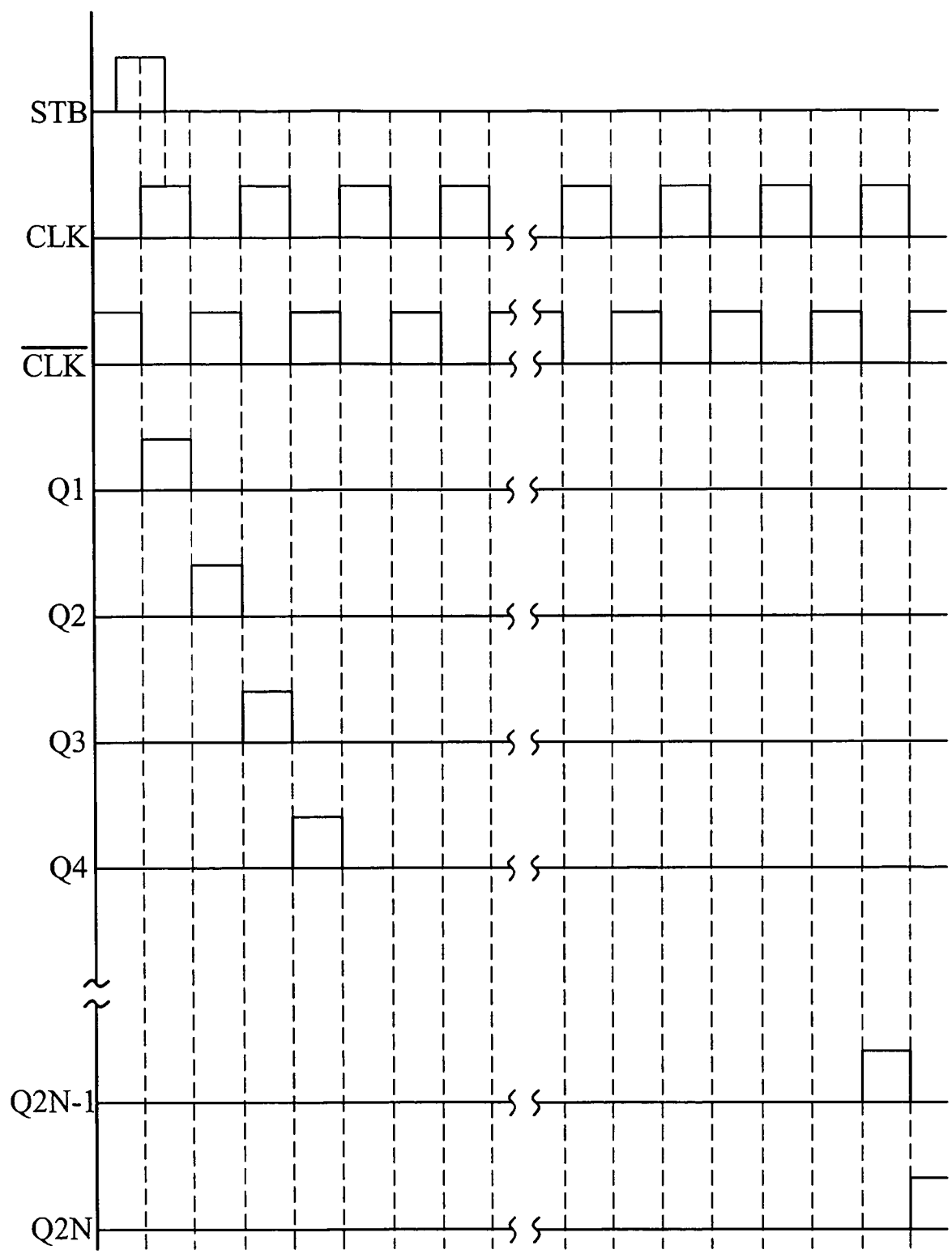
FIG. 7 is an operation signal diagram of the signal driving circuit shown in FIG. 6.

FIG. 6 is a schematic diagram of a signal driving circuit 300 according to various embodiments of the present teachings. As shown in FIG. 6, signal driving circuit 300 can comprise a plurality of serially connected shift register units SR1~SRN, wherein each shift register unit can be similar to that shown in FIG. 3 or FIG. 4. The serially connected shift register units SR1~SRN output signals (Q1, Q2, Q3, ..., Q2N-1 and Q2N) in turn. The start pulse of the first unit in the present-stage shift register unit is the second output pulse of the pre-stage shift register unit. The present-stage shift register unit outputs first and second output pulses in turn after a predetermined delay, and the second output pulse is input to the next-stage shift register unit. Thus, the shift register circuit outputs a plurality of pulses for driving the LCD panel. FIG. 7 is an operation signal diagram of the signal driving circuit 300.

Figure 8:
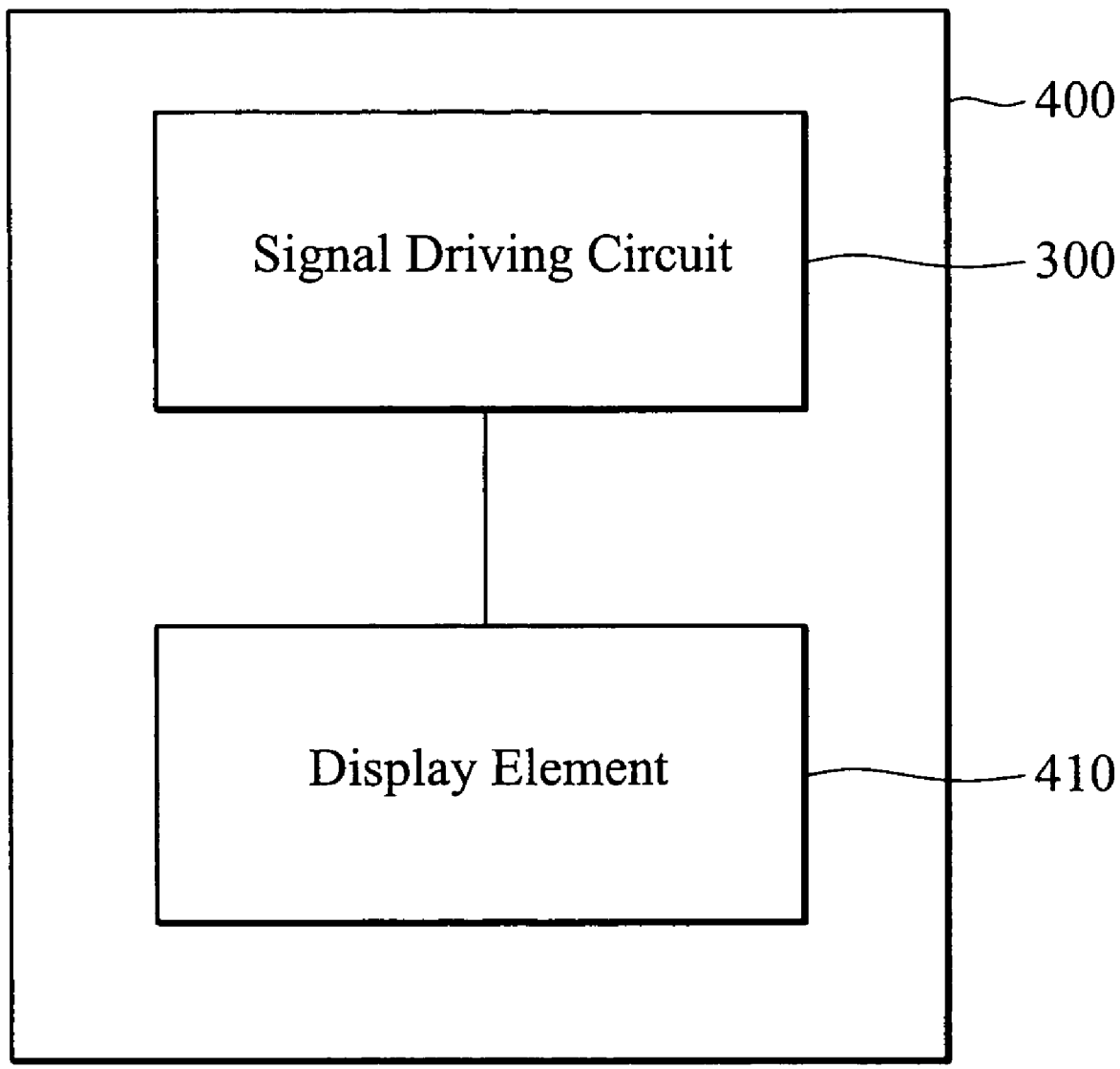
FIG. 8 is a schematic diagram of a display system comprising a signal driving circuit according to various embodiments of the present teachings.

As shown in FIG. 8, in a display system 400, a display element 410, such as a LCD element, is operatively coupled to the signal driving circuit 300 described above. The signal driving circuit 300 outputs a plurality of pulses in turn to drive display element 410. In the present invention, display element 410 can also be a plasma display element, an organic light emitting display element, or a cathode ray tube display element.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift register unit, comprising:
a first unit comprising a first input terminal and a second input terminal coupled to a start pulse and a clock signal respectively, to output a first output pulse during a first period; and a second unit comprising a first input terminal and a second input terminal coupled to the first output pulse and an inverse signal of the clock signal respectively, to output a second output pulse during a second period, wherein the first unit comprises:
  a first clock inverter comprising an input terminal coupled to the clock signal to output a first signal during the first period;
  a second clock inverter comprising an input terminal coupled to the first output pulse to output a second signal during the second period;
  a first inverter coupled to the first clock inverter to convert the first signal into the first output pulse during the first period;
  a first NOR gate comprising a first input terminal coupled to the start pulse, a second input terminal coupled to the output terminal of the first inverter, and an output terminal; and
  a second inverter comprising an input terminal coupled to the output terminal of the first NOR gate, wherein the first clock inverter further comprises a first control terminal coupled to the output terminal of the first NOR gate and a second control terminal coupled to the output terminal of the second inverter, and the second clock inverter further comprises a first control terminal coupled to the output terminal of the second inverter and a second control terminal coupled to the output terminal of the first NOR gate, and the first clock inverter comprises:
    a first PMOS transistor comprising a first terminal coupled to a first voltage, a control terminal coupled to the output terminal of the first NOR gate, and a second terminal;
    a second PMOS transistor comprising a first terminal coupled to the second terminal of the first PMOS transistor, a control terminal coupled to the clock signal and a second terminal coupled to the input terminal of the first inverter;
    a first NMOS transistor comprising a first terminal and a control terminal coupled to the second terminal and the control terminal of the second PMOS transistor respectively, and a second terminal; and
    a second NMOS transistor comprising a first terminal coupled to the second terminal of the first NMOS transistor, a control terminal coupled to the output terminal of the second inverter and a second terminal coupled to a second voltage.

2. The shift register unit as claimed in claim 1, wherein the second unit comprises:
  a third clock inverter coupled to the inverse signal of the clock signal, wherein the third clock inverter turns on to output a third signal during the second period; and
  a second third inverter coupled to the third clock inverter to convert the third signal into the second output pulse during the second period.

3. The shift register unit as claimed in claim 2, wherein the second unit further comprises:
  a second NOR gate comprising a first input terminal coupled to the output terminal of the first inverter and a second input terminal coupled to the output terminal of the third inverter and an output terminal; and
  a fourth inverter comprising an input terminal coupled to the output terminal of the second NOR gate, and an output terminal.

4. The shift register unit as claimed in claim 3, wherein the third clock inverter further comprises a first control terminal coupled to the output terminal of the second NOR gate and a second control terminal coupled to the output terminal of the fourth inverter.

5. A signal driving circuit, comprising:
  N shift register units each as claimed in claim 1, connected serially to generate 2N output pulses in turn, wherein the second output pulse of a $M^{th}$ shift register unit of the N shift register units is input to the first unit of a $M+1^{th}$ shift register unit, and $N \geq M$.

6. A display system, comprising:
  a signal driving circuit as claimed in claim 5; and
  a display element coupled to the signal driving circuit, wherein the display element is driven by the output pulses from the signal driving circuit.

7. The display system as claimed in claim 6, wherein the display element is a liquid crystal display element, a plasma display element, an organic light emitting display element, or a cathode ray tube element.

8. A shift register unit, comprising:
  a first NOR gate comprising a first input terminal coupled to a start pulse, a second input terminal and an output terminal;
  a first inverter comprising an input terminal coupled to the output terminal of the first NOR gate and an output terminal;
  a first clock inverter comprising an input terminal coupled to a clock signal, a first control terminal coupled to the output terminal of the first NOR gate, a second control terminal coupled to the output terminal of the first inverter and an output terminal;
  a second inverter comprising an input terminal coupled to the output terminal of the first clock inverter and an output terminal coupled to the second input terminal of the first NOR gate, and outputting a first output pulse;
  a second clock inverter comprising an input terminal coupled to the output terminal of the second inverter, a first control terminal coupled to the output terminal of the first inverter, a second control terminal coupled to the output terminal of the first NOR gate and an output terminal coupled to the output terminal of the first clock inverter;
  a second NOR gate comprising a first input terminal coupled to the output terminal of the second inverter, a second input terminal and an output terminal;
  a third inverter comprising an input terminal coupled to the output terminal of the second NOR gate and an output terminal;
  a third clock inverter comprising an input terminal coupled to an inverse signal of the clock signal, a first control terminal coupled to the output terminal of the second NOR gate, a second control terminal coupled to the output terminal of the third inverter and an output terminal;
  a fourth inverter comprising an input terminal coupled to the output terminal of the third clock inverter and an output terminal coupled to the second input terminal of the second NOR gate, outputting a second output pulse; and
  a fifth inverter comprising an input terminal coupled to the clock signal and an output terminal coupled to the input terminal of the third clock inverter,
    wherein the first clock inverter comprises:
      a first PMOS transistor comprising a first terminal coupled to a first voltage, a control terminal coupled to the output terminal of the first NOR gate, and a second terminal;

a second PMOS transistor comprising a first terminal coupled to the second terminal of the first PMOS transistor, a control terminal coupled to the clock signal and a second terminal coupled to the input terminal of the second inverter;

a first NMOS transistor comprising a first terminal and a control terminal coupled to the second terminal and the control terminal of the second PMOS transistor respectively, and a second terminal; and a second NMOS transistor comprising a first terminal coupled to the second terminal of the first NMOS transistor, a control terminal coupled to the output terminal of the first inverter and a second terminal coupled to a second voltage.

9. The shift register unit as claimed in claim 8, wherein the second clock inverter comprises:

a third PMOS transistor comprising a first terminal coupled to the first voltage, a control terminal coupled to the output terminal of the first inverter, and a second terminal;

a fourth PMOS transistor comprising a first terminal coupled to the second terminal of the third PMOS transistor, a control terminal coupled to the output terminal of the second inverter, and a second terminal coupled to the input terminal of the second inverter and the second terminal of the second PMOS transistor;

a third NMQS transistor comprising a first terminal and a control terminal coupled to the second terminal and the control terminal of the fourth PMOS transistor respectively, and a second terminal; and a fourth NMOS transistor comprising a first terminal coupled to the second terminal of the third NMOS transistor, a control terminal coupled to the control terminal of the first PMOS transistor and a second terminal coupled to the second voltage.

10. The shift register unit as claimed in claim 9, wherein the third clock inverter comprises:

a fifth PMOS transistor comprising a first terminal coupled to the first voltage, a control terminal coupled to the output terminal of the second NOR gate and the input of the third inverter, and a second terminal;

a sixth PMOS transistor comprising a first terminal coupled to the second terminal of the fifth PMOS transistor, a control terminal coupled to the inverse signal of the clock signal and a second terminal coupled to the input terminal of the fourth inverter;

a fifth NMOS transistor comprising a first terminal and a control terminal coupled to the second terminal and the control terminal of the sixth PMOS transistor respectively, and a second terminal; and a sixth NMOS transistor comprising a first terminal coupled to the second terminal of the fifth NMOS transistor, a second terminal coupled to the second voltage, and a control terminal coupled to the output terminal of the third inverter.

11. The shift register unit as claimed in claim 8, further comprising a fifth inverter comprising an input terminal coupled to the clock signal and an output terminal coupled to the input terminal of the third clock inverter.

12. A signal driving circuit, comprising:

N shift register units as claimed in claim 8, connected serially to generate 2N output pulses in turn, wherein the second output pulse of a $M^{th}$ shift register unit of the N shift register units is input to the first terminal of the first NOR gate of a $M+1^{th}$ shift register unit, and $N \geq M$.

13. A display system, comprising:

a display element; and a signal driving circuit comprising:

N shift register units as claimed in claim 8, connected serially to generate 2N output pulses in turn, wherein the second output pulse of a $M^{th}$ shift register unit of the N shift register units is input to the first terminal of the first NOR gate of a $M+1^{th}$ shift register unit, and $N \geq M$, wherein the signal driving circuit generates a plurality of output pulses to drive the display element 14. The display system as in claim 13, wherein the display element is a liquid crystal display element, a plasma display element, an organic light emitting display element, or a cathode ray tube element.

* * * * *